United States Patent
Geerlings et al.

(10) Patent No.: US 11,615,836 B2
(45) Date of Patent: Mar. 28, 2023

(54) DEVICES AND METHODS FOR ADAPTIVE RETENTION VOLTAGE IN VOLATILE MEMORY

(71) Applicant: NXP USA, Inc., Austin, TX (US)

(72) Inventors: Jurgen Geerlings, Suzhou (CN); Glenn Charles Abeln, Buda, TX (US)

(73) Assignee: NXP USA, Inc., Austin, TX (US)

( * ) Notice: Subject to any disclaimer, the term of this patent is extended or adjusted under 35 U.S.C. 154(b) by 45 days.

(21) Appl. No.: 17/405,240

(22) Filed: Aug. 18, 2021

(65) Prior Publication Data
US 2022/0068368 A1 Mar. 3, 2022

(30) Foreign Application Priority Data
Aug. 26, 2020 (CN) .......................... 202010874323.9

(51) Int. Cl.
*G11C 5/14* (2006.01)
*G11C 11/417* (2006.01)

(52) U.S. Cl.
CPC ............ *G11C 11/417* (2013.01); *G11C 5/147* (2013.01)

(58) Field of Classification Search
CPC .................. G11C 11/417; G11C 5/147; G11C 2207/2227; G11C 11/4074; G06F 3/064
See application file for complete search history.

(56) References Cited

U.S. PATENT DOCUMENTS

| | | | |
|---|---|---|---|
| 8,004,924 B2 | 8/2011 | Leomant et al. | |
| 8,327,158 B2 | 12/2012 | Titiano et al. | |
| 8,972,755 B1 | 3/2015 | Hasko et al. | |
| 9,123,436 B2 | 9/2015 | Chiou et al. | |
| 11,152,046 B1* | 10/2021 | Raszka | G11C 11/413 |
| 2010/0103760 A1* | 4/2010 | Mair | G11C 5/147 |
| | | | 365/230.03 |
| 2012/0026805 A1* | 2/2012 | Tang | G11C 5/147 |
| | | | 365/226 |
| 2013/0003442 A1 | 1/2013 | Asthana | |
| 2015/0106671 A1* | 4/2015 | Guo | G11C 29/50016 |
| | | | 714/721 |
| 2021/0142863 A1* | 5/2021 | Nazar | G11C 11/409 |
| 2022/0028479 A1* | 1/2022 | Nazar | G11C 11/419 |

FOREIGN PATENT DOCUMENTS

KR 20160083963 A 7/2016

* cited by examiner

*Primary Examiner* — Khamdan N. Alrobaie

(57) ABSTRACT

An integrated circuit (IC) includes a plurality of volatile memory (VM) blocks, and a power gate control circuit configured to control power gating for each VM block of a plurality of VM blocks. The IC includes a power mode controller circuit configured to select a power mode, and in response to selecting a retention mode as the power mode, the power mode controller circuit gates a supply voltage from each block of a selected subset of the plurality of VM blocks and allows a retention voltage to power each VM block of a remaining subset of the plurality of VM blocks outside the selected subset. The IC includes a voltage controller circuit configured to determine a voltage level of the retention voltage based on a minimum retention voltage required for each VM block of the remaining subset.

20 Claims, 2 Drawing Sheets ical: cases and methods for adaptive retention voltage in volatile memory

BACKGROUND

Field

This disclosure relates generally to semiconductor devices, and more specifically, to adapting retention voltage for blocks of volatile memory.

Related Art

Semiconductor devices may switch to low power modes where circuitry is not active, but the circuit state is retained in volatile memory to avoid a full power down of a device. Low power modes can save time and effort by allowing a user to begin where they left off before entering the low power mode instead of requiring a full power down/power up cycle and losing data from the previous session. The voltage level during state retention is lower than the active level to reduce power consumption. In existing low power state retention solutions used to retain state in volatile memory, for example in microcontrollers, the retention voltage level is based on the maximum amount of volatile memory to be retained. Leakage current is directly proportional to the voltage level applied to the bit cells in the memory device.

The leakage current of an array containing a large number of memory cells, for example, more than 1 Megabyte of volatile memory bit cells, will be a particular value at a retention voltage that allows proper operation across process, voltage and temperature (PVT) variations for all bit cells. The retention voltage is determined by the probability of bit cell failure due to insufficient voltage being supplied to retain the data being held by the bit cell. This probability of failure is proportional to the number of bit cells in retention mode. However, when the amount of volatile memory is reduced to a smaller quantity, for example 32 kilobytes, then the retention voltage can be reduced, thereby reducing the leakage current. Normally, the retention voltage is chosen for the worst case that includes a large number of bit cells in retention mode.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of systems and methods are disclosed in which a minimum level of voltage required to retain data in blocks of volatile memory is determined for each block based on the number of bit cells in the block. Once a low power mode is entered that requires data in at least some of the blocks to be retained, the maximum value of the minimum level of voltage for the group of blocks in retention is selected as the retention voltage for all of the blocks in the group. In prior known systems, the retention voltage was selected based on the total amount of memory in the entire volatile memory device even though the largest block may not be among those blocks with data to retain during a low power mode. Blocks with fewer memory cells require less retention voltage. By selecting the retention voltage based on the amount of volatile memory to be retained in the largest of a subset of the blocks, the leakage current can be reduced significantly, even by an exponential factor, thereby reducing power consumption.

Figure 1:
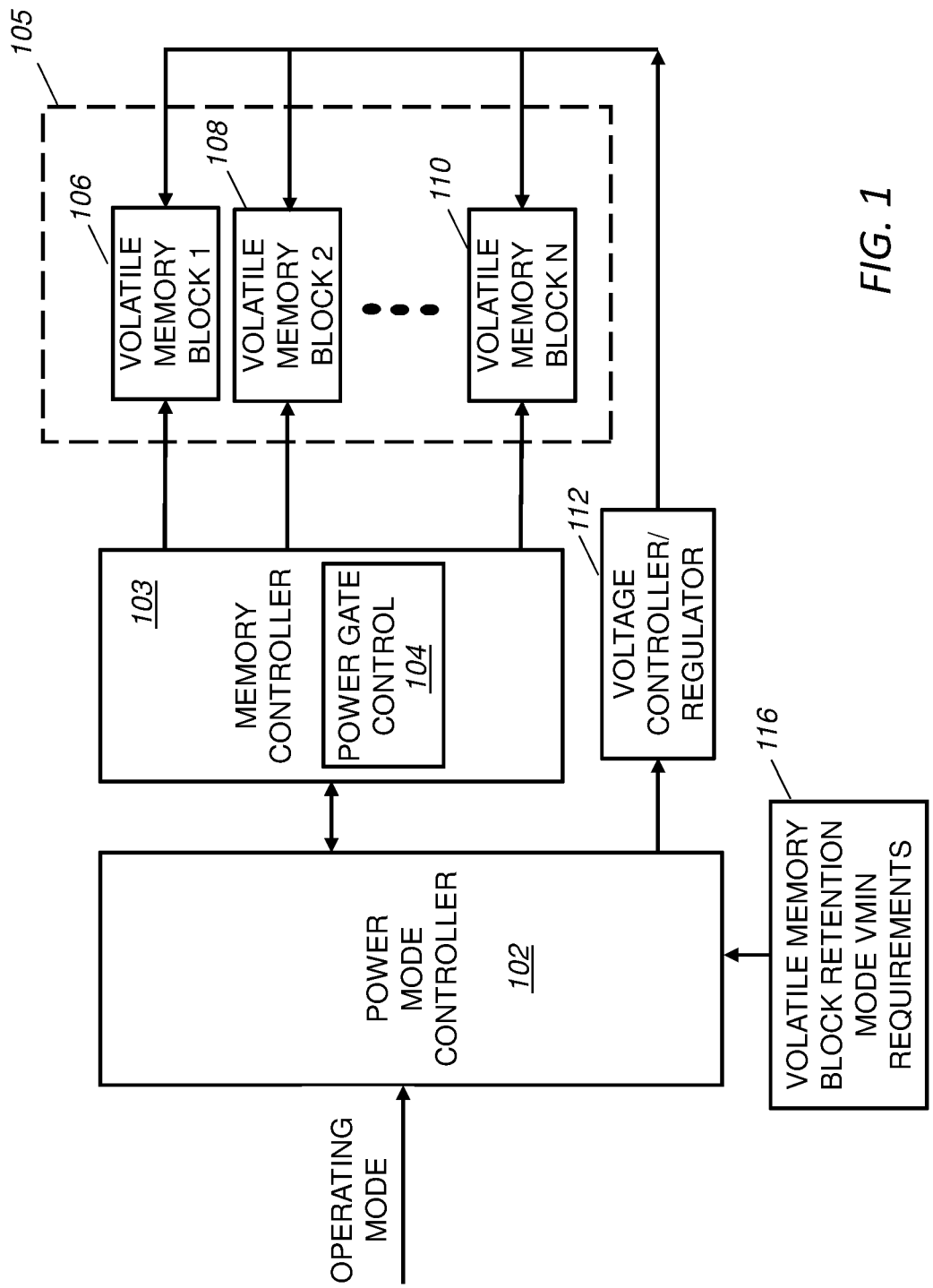
FIG. 1 illustrates a block diagram of components of a processing system in accordance with selected embodiments of the present invention.

FIG. 1 illustrates a block diagram of components for controlling retention voltage for blocks of volatile memory with different numbers of bit cells in a processing system in accordance with selected embodiments of the present invention. The components include power mode controller circuit 102, memory controller circuit 103 with power gate control circuit 104, volatile memory device 105 with an array of bit cells grouped in blocks 106, 108, 110, voltage control/regulator circuit 112, and storage circuitry 116 for storing values of minimum retention mode voltage (Vmin,k) requirements for volatile memory blocks 106, 108, 110.

Power mode controller circuit 102 receives an operating mode as input from another device, such as a master processing core (not shown). It is common for a processing system to implement an active operating mode where all required circuitry is powered to provide full functional capabilities, along with one or more reduced power modes that implement various levels of reduced functionality. The reduced power modes are implemented to reduce power consumption and conserve available power, particularly in battery operated devices.

Power mode controller circuit 102 correlates the operating mode with one or more voltage levels required to provide the functionality enabled in each operating mode. The voltage level can also be "not-powered" either in active or reduced power modes when a circuit is not required in that particular mode. The required voltage levels are output to memory controller circuit 103 and voltage controller/regulator circuit 112. For example, power controller 102 can signal memory controller circuit 103 and voltage control/regulator circuit 112 to provide active mode voltage level for full operational capability of memory device 105. In one or more levels of low power modes, the content of at least some of blocks 106, 108, 110 in memory device 105 is retained although memory device 105 does not have full operational capability to write and read data into the bit cells in memory blocks 106, 108, 110. Voltage controller/regulator circuit 112 receives the required voltage level signal from power mode controller circuit 102 and supplies a corresponding regulated voltage to one or more of blocks 106, 108, 110 based on whether full functionality is enabled, or a lower power operational state is enabled in which contents of one or more of volatile memory blocks 106, 108, 110 is retained despite limited functionality.

Blocks 106, 108, 110 can each include a different number of bit cells and can therefore have different Vmin requirements for retaining state information during low power retention modes. Also, the number of blocks 106, 108, 110 in retention mode may differ depending on the selected power mode. The minimum retention voltage Vmin of each block 106, 108, 110 is tracked and stored. The minimum retention voltage may or may not scale with the number of bit cells in a block. For example, the Vmin of a small block may have a higher Vmin than a larger block, due to one tail bit. Power mode controller circuit 102 uses this information to determine the maximum Vmin of whichever blocks 106, 108, 110 are selected to be in retention mode. If the Vmin of each block is stored, the Vmin of any combination of those blocks (i.e. the maximum) can be calculated even if there is an anomalous tail bit somewhere. Information regarding the minimum level of voltage required to retain data in each block 106, 108, 110 is stored in volatile memory block retention mode Vmin requirements circuit 116. The relation between the size of each block 106, 108, 110 and the minimum retention voltage for the block can be hard coded or implemented as look-up table in registers. Alternatively, the Vmin information for each block 106, 108, 110 can be determined and generated by software executed by a state-machine in a central processing unit, digital signal processor, or other suitable hardware, firmware or software or combination thereof.

The amount of memory retained in memory device 105 can be found starting with the total amount of memory and subtracting the amount of memory that is power gated. Power gating shuts off current to blocks 106, 108, 110 that are not in use to reduce power consumption. Power gating control circuit 104 generates control signals that are provided to a power gating device (not shown) in memory device 105. Some of blocks 106, 108, 110 may be power gated and the data held by power gated blocks may be transferred to retention registers such as flip flops (not shown). Other of blocks 106, 108, 110 that are not power gated or in active mode may retain the contents in the bit cells during specified low power modes.

Power mode controller circuit 102 can be implemented by dedicated hardware that can be controlled by a central processing unit. Power mode controller circuit 102 controls the power state of multiple volatile memory blocks 106, 108, 110 depending on the power mode of the device in which power mode controller circuit 102 is implemented. In active mode some of memory blocks 106, 108, 110 are fully operational while other of memory blocks 106, 108, 110 may be in retention mode or are power gated. Voltage controller/regulator 112 supplies regulated voltage to each of blocks 106, 108, 110 that are not power gated. When power mode controller circuit 102 selects active mode as the power mode, power gate control circuit 104 allows an operating supply voltage to be provided to each of blocks 106, 108, 110 that is in active mode while a retention voltage is provided to each of blocks 106, 108, 110 in retention mode.

In some low power states when information in memory device 105 is retained, some of memory blocks 106, 108, 110 can be in retention mode while other of memory blocks 106, 108, 110 can be power gated. Whenever one or more of memory blocks 106, 108, 110 are placed in retention mode, the supply voltage level from voltage controller/regulator 112 is adjusted based on memory blocks 106, 108, 110 in the power gating state. When memory blocks 106, 108, 110 return from retention mode to active mode, then the supply voltage is increased to the active mode level.

In lower power modes, therefore, power mode controller circuit 102 provides a signal indicating a lower power level to be used than the power level used during full operational or active mode. Memory controller 103 determines which of memory blocks 106, 108, 110 are power gated and which of memory blocks 106, 108, 110 are in retention mode. The power state for memory blocks 106, 108, 110 is programmed using a register setting in power mode controller 102 and, based on that information, power mode controller 102 determines a retention voltage to be provided to voltage controller/regulator circuit 112 using the Vmin requirements 116 for blocks 106, 108, 110 in retention mode. When more than one of memory blocks 106, 108, 110 is in retention mode, the Vmin voltage for the block with the maximum Vmin voltage for all the blocks in retention can be selected as the retention voltage for all the memory blocks 106, 108, 110 in retention mode. In addition, an extra margin or guardband of voltage can be added to the selected Vmin to help ensure the content of blocks 106, 108, 110 is retained.

In cases where the total number of bit cells in each of blocks 106, 108, 110 in retention mode is less than the block with the maximum number of bit cells that can be set to retention mode, the retention voltage will be lower than in previously known systems where the retention voltage for the block with the highest total number of bit cells, whether currently in retention mode or not, is used for all blocks in retention mode. As a result, previously known systems use higher retention voltage than needed, causing higher leakage current and power consumption than systems and devices that implement embodiments of the present invention.

Figure 2:
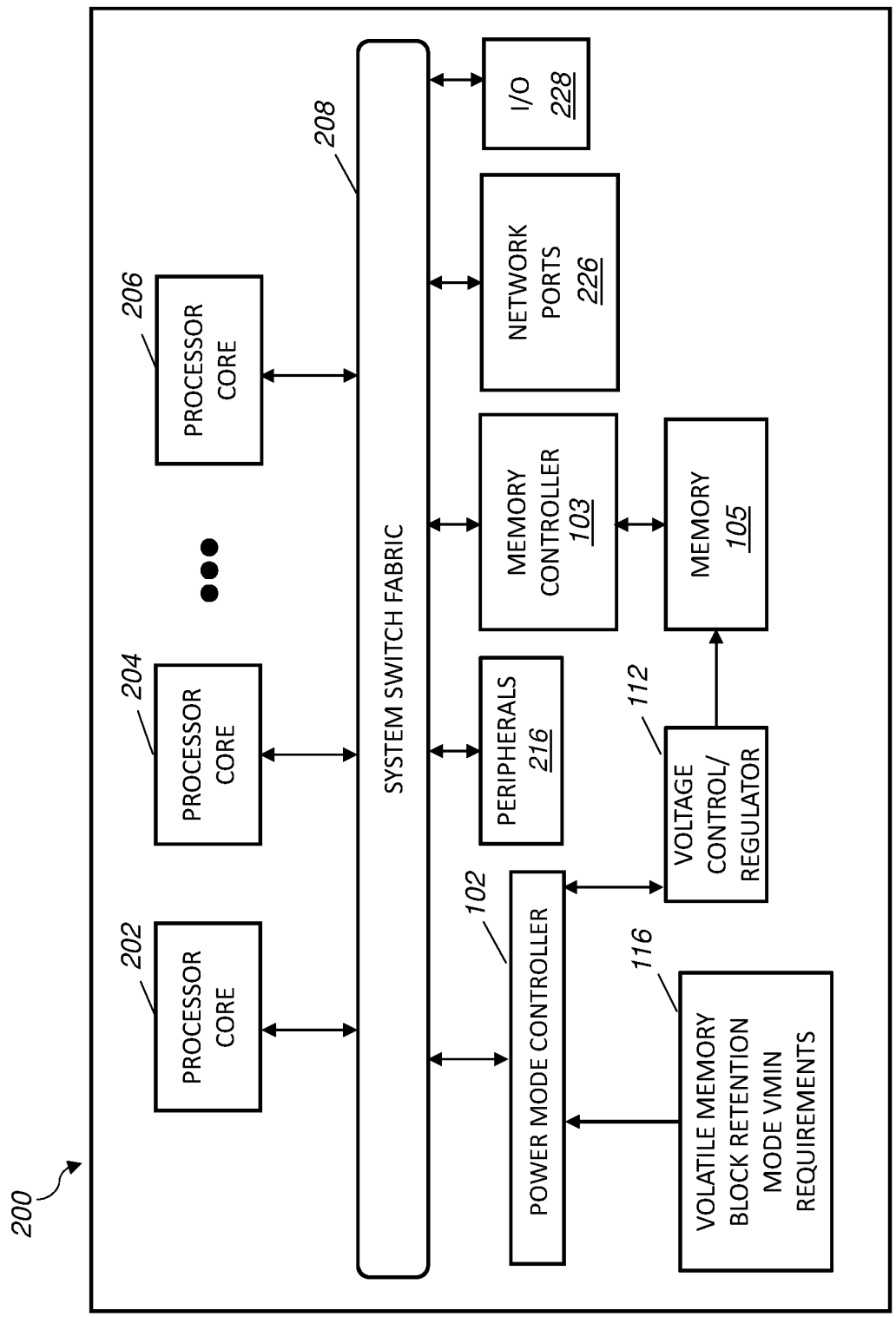
FIG. 2 illustrates a block diagram of a processing system in accordance with selected embodiments of the invention.

Referring to FIG. 2, a simplified block diagram illustrating an example of a multi-core processing system 200 is shown that can be used to implement embodiments of the present invention. Processing system 200 includes one or more processor cores 202, 204, 206, system switch fabric 208, power mode controller circuit 102, voltage controller/regulator circuit 112, memory controller circuit 103, memory device 105, volatile memory block retention mode Vmin requirements storage device 116, peripherals 216, network ports 226, and input/output (I/O) ports 228. Switch fabric 208 communicatively couples all illustrated components 102, 103, and 202-128 of multi-core processing system 200.

Processing cores 202, 204, 206 include computer processor circuitry capable of performing functions that may be implemented as software instructions, hardware circuitry, firmware, or a combination of software, hardware and firmware. Operations and functions may be performed under the control of an operating system. One or more instances of software application code may be executed at the same time. Application code being executed by processing cores 202, 204, 206 may access data and instructions in memory 105 via system switch fabric 208 and memory controller 103. Processing cores 202, 204, 206 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. In addition or in the alternative, processing cores 202, 204, 206 may be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processing system 200 can also include one or more network ports 226 configurable to connect to one or more networks, which may likewise accessible to one or more remote nodes. The remote nodes can include other applications processors, devices or sensors that can exchange information with processing system 200.

System switch fabric 208 routes requests and responses between CPUs 202, 204, 206 and power mode controller 102, peripheral interfaces 216, memory controller 103 and I/O devices 228.

Peripherals interface(s) 216 are communicatively coupled to system switch fabric 208. Peripheral interfaces 216 can include, for example, circuitry to perform power management, flash management, interconnect management, USB, and other PHY type tasks. A variety of peripheral devices (not shown) such as sensors, field programmable gate arrays, external integrated circuits, a mouse, keyboard, printer, display monitor, external memory drives, cameras, and lights, among others, can be coupled to processing system 200 via peripheral interfaces 216.

Memory device 105 may include one or more volatile storage (or memory) devices such as random access memory (RAM), dynamic RAM (DRAM), synchronous DRAM (SDRAM), static RAM (SRAM), or other types of volatile storage devices. In addition or in the alternative, memory device 105 may include non-volatile memory, such as read only memory (ROM), electrically erasable programmable ROM, flash memory, magnetic RAM, resistive RAM, or the like. In whatever form, memory device 105 may store information including sequences of instructions that are executed by the processing device or any other device. For example, executable code and/or data, in including but not limited to an operating system, device drivers, firmware (e.g., input output basic system or BIOS), and/or applications can be loaded in the memory and executed by processor cores 202, 204, 206.

By now it should be appreciated that by tailoring the level of retention voltage (Vmin) to the maximum Vmin among all blocks in retention mode, along with power gating blocks that are not being used, power consumption is reduced, with the benefit of energy savings, and longer charge life to battery powered devices.

In some embodiments, an integrated circuit that can comprise a plurality of volatile memory (VM) blocks (106, 108 110), a power gate control circuit (104) configured to control power gating for each VM block of the plurality of VM blocks, a power mode controller circuit (102) configured to select a power mode for the integrated circuit, wherein in response to the power mode controller circuit selecting a retention mode as the power mode, the power gate control circuit gates a supply voltage from each block of a selected subset (N-k) of the plurality of VM blocks and allows a retention voltage to power each VM block of a remaining subset (k) of the plurality of VM blocks outside the selected subset, and a voltage controller circuit configured to determine a voltage level of the retention voltage based on a minimum retention voltage required for each VM block of the remaining subset (Vmin,k).

In some aspects, the integrated circuit can further comprise storage circuitry (116) coupled to the voltage controller circuit, configured to store a corresponding minimum retention voltage for each VM block of the plurality of VM blocks.

In other aspects, the voltage controller circuit can be configured to determine the voltage level of the retention voltage by selecting a maximum value of the minimum retention voltages corresponding to the remaining subset of VM blocks (Max{Vmin,k}).

In further aspects, the voltage level of the retention voltage can include a margin voltage in addition to a voltage required to maintain state in the VM blocks of the remaining subset (guard-banded).

In still further aspects, the integrated circuit can further comprise a voltage regulator (112) configured to provide a corresponding supply voltage to each VM block of the plurality of blocks, wherein the voltage controller circuit is configured to indicate the voltage level of the retention voltage to the voltage regulator.

In still further aspects, the voltage regulator can provide the voltage level of the retention voltage indicated by the voltage controller circuit as the corresponding supply voltages during the retention mode (e.g. voltage controller indicates the exact retention level needed).

In still further aspects, the voltage regulator can be configured to provide one regulated voltage of a set of predetermined regulated voltages as the corresponding supply voltages during the retention mode. The voltage controller circuit can be configured to indicate the voltage level of the retention voltage by selecting one predetermined regulated voltage from the set of predetermined regulated voltages (e.g., the voltage regulator can only output a limited number of voltages, and controller selects one that is closest to (and greater than) what it needs).

In still further aspects, the integrated circuit can comprise a static random access memory (SRAM), wherein the SRAM is divided into the plurality of NV memory blocks.

In still further aspects, the voltage controller circuit can be configured to determine the voltage level of the retention voltage based on a total number of VM blocks in the remaining subset.

In still further aspects, in response to the power mode controller circuit selecting active mode as the power mode, the power gate control circuit can allow an operating supply voltage to power each VM block of a second selected subset of the plurality of VM blocks (blocks which are active).

In still further aspects, in response to the power mode controller circuit selecting active mode as the power mode, the power gate control circuit can further gate power from one or more VM blocks of the plurality of VM blocks outside the second selected subset (active VM blocks plus VM blocks which are power gated).

In still further aspects, in response to the power mode controller circuit selecting active mode as the power mode, the power gate control circuit further allows a second retention voltage to power one or more VM blocks of the plurality of VM blocks outside the second selected subset (covers active VM blocks plus VM blocks which are in retention).

In other embodiments, an integrated circuit can comprise a volatile memory divided into a plurality of blocks, a voltage regulator configured to provide a supply voltage to each block of the plurality of blocks, a power gate control circuit configured to control power gating of the supply voltage for each block of the plurality of blocks, and a power mode controller configured to select a power mode for the integrated circuit. In response to selecting the retention mode, the power gate control circuit prevents the supply voltage from powering each block of a selected subset of the plurality of blocks and allows the supply voltage to power each block of a remaining subset of the plurality of blocks outside the selected subset of the plurality of blocks. A voltage controller circuit can be configured to indicate a retention voltage level to the voltage regulator to provide as the supply voltage during the retention mode. The voltage controller is configured to determine the retention voltage level based on a minimum retention voltage level required for each block of the remaining subset.

In further aspects, the integrated circuit can comprise storage circuitry coupled to the voltage controller circuit, configured to store a corresponding minimum retention voltage level for each block of the remaining subset.

In still further aspects, the voltage controller circuit can be configured to select a maximum value of the minimum retention voltages levels corresponding to the blocks of the remaining subset, and to indicate the retention voltage level based on the selected maximum value.

In still further aspects, the voltage regulator can be configured to provide one regulated voltage of a set of predetermined regulated voltages as the supply voltage. The voltage controller circuit can be configured to indicate the retention voltage level by selecting one predetermined regulated voltage from the set of predetermined regulated voltages.

In still further aspects, the nonvolatile memory can be characterized as a static random access memory (SRAM).

In further embodiments, a method can comprise entering data retention mode for a volatile memory, wherein the volatile memory is divided into a plurality of blocks. In response to entering the data retention mode, a retention subset of the plurality of blocks is selected, wherein each block of the retention subset remains powered by a retention voltage while in the data retention mode and each block of the plurality of blocks not in the retention subset is powered down while in the data retention mode. A voltage level of the retention voltage provided to each block of the retention subset during the retention mode is determined based on a minimum retention voltage required for each block of the retention subset.

In further aspects, determining the voltage level of the retention voltage provided to each block of the retention subset during the retention mode can comprise selecting a maximum value of the minimum retention voltages required for the blocks of the retention subset, and setting the voltage level of the retention voltage based on the selected maximum value.

In further aspects, determining the voltage level of the retention voltage provided to each block of the retention subset during the retention mode can further comprise accessing storage circuitry configured to store a corresponding minimum retention voltage for each block of the plurality of blocks.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure is described herein with reference to specific embodiments, various modifications and changes can be made without departing from the scope of the present disclosure as set forth in the claims below. For example, components for implementing Vmin for memory blocks 106, 108, 110 in retention mode may be used in any type of device that uses volatile memory devices and implements low power modes. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. An integrated circuit comprising:
   a plurality of volatile memory (VM) blocks;
   a power gate control circuit configured to control power gating for each VM block of the plurality of VM blocks;
   a power mode controller circuit configured to select a power mode for the integrated circuit, wherein in response to the power mode controller circuit selecting a retention mode as the power mode, the power gate control circuit gates a supply voltage from each block of a selected subset of the plurality of VM blocks and allows a retention voltage to power each VM block of a remaining subset of the plurality of VM blocks outside the selected subset; and
   a voltage controller circuit configured to determine a voltage level of the retention voltage based on a minimum retention voltage required for each VM block of the remaining subset.

2. The integrated circuit of claim 1, further comprising:
   storage circuitry coupled to the voltage controller circuit, configured to store a corresponding minimum retention voltage for each VM block of the plurality of VM blocks.

3. The integrated circuit of claim 2, wherein the voltage controller circuit is configured to determine the voltage level of the retention voltage by selecting a maximum value of the minimum retention voltages corresponding to the remaining subset of VM blocks.

4. The integrated circuit of claim 3, wherein the voltage level of the retention voltage includes a margin voltage in addition to a voltage required to maintain state in the VM blocks of the remaining subset.

5. The integrated circuit of claim 1, further comprising:
   a voltage regulator configured to provide a corresponding supply voltage to each VM block of the plurality of blocks, wherein the voltage controller circuit is configured to indicate the voltage level of the retention voltage to the voltage regulator.

6. The integrated circuit of claim 5, wherein the voltage regulator provides the voltage level of the retention voltage indicated by the voltage controller circuit as the corresponding supply voltages during the retention mode.

7. The integrated circuit of claim 5, wherein the voltage regulator is configured to provide one regulated voltage of a set of predetermined regulated voltages as the corresponding supply voltages during the retention mode, wherein the voltage controller circuit is configured to indicate the voltage level of the retention voltage by selecting one predetermined regulated voltage from the set of predetermined regulated voltages.

8. The integrated circuit of claim 1, wherein the integrated circuit comprises a static random access memory (SRAM), wherein the SRAM is divided into the plurality of NV memory blocks.

9. The integrated circuit of claim 1, wherein the voltage controller circuit is configured to determine the voltage level of the retention voltage based on a total number of VM blocks in the remaining subset.

10. The integrated circuit of claim 1, wherein in response to the power mode controller circuit selecting active mode as the power mode, the power gate control circuit allows an operating supply voltage to power each VM block of a second selected subset of the plurality of VM blocks.

11. The integrated circuit of claim 10, wherein in response to the power mode controller circuit selecting active mode as the power mode, the power gate control circuit further gates power from one or more VM blocks of the plurality of VM blocks outside the second selected subset.

12. The integrated circuit of claim 10, wherein in response to the power mode controller circuit selecting active mode as the power mode, the power gate control circuit further allows a second retention voltage to power one or more VM blocks of the plurality of VM blocks outside the second selected subset.

13. An integrated circuit comprising:
a volatile memory divided into a plurality of blocks;
a voltage regulator configured to provide a supply voltage to each block of the plurality of blocks;
a power gate control circuit configured to control power gating of the supply voltage for each block of the plurality of blocks;
a power mode controller configured to select a power mode for the integrated circuit, wherein in response to selecting the retention mode, the power gate control circuit prevents the supply voltage from powering each block of a selected subset of the plurality of blocks and allows the supply voltage to power each block of a remaining subset of the plurality of blocks outside the selected subset of the plurality of blocks; and
a voltage controller circuit configured to indicate a retention voltage level to the voltage regulator to provide as the supply voltage during the retention mode, wherein the voltage controller is configured to determine the retention voltage level based on a minimum retention voltage level required for each block of the remaining subset.

14. The integrated circuit of claim 13, further comprising:
storage circuitry coupled to the voltage controller circuit, configured to store a corresponding minimum retention voltage level for each block of the remaining subset.

15. The integrated circuit of claim 14, wherein the voltage controller circuit is configured to select a maximum value of the minimum retention voltages levels corresponding to the blocks of the remaining subset, and to indicate the retention voltage level based on the selected maximum value.

16. The integrated circuit of claim 13, wherein the voltage regulator is configured to provide one regulated voltage of a set of predetermined regulated voltages as the supply voltage, wherein the voltage controller circuit is configured to indicate the retention voltage level by selecting one predetermined regulated voltage from the set of predetermined regulated voltages.

17. The integrated circuit of claim 13, wherein the non-volatile memory is characterized as a static random access memory (SRAM).

18. A method comprising:
entering data retention mode for a volatile memory, wherein the volatile memory is divided into a plurality of blocks;
in response to entering the data retention mode, selecting a retention subset of the plurality of blocks, wherein each block of the retention subset remains powered by a retention voltage while in the data retention mode and each block of the plurality of blocks not in the retention subset is powered down while in the data retention mode; and
determining a voltage level of the retention voltage provided to each block of the retention subset during the retention mode based on a minimum retention voltage required for each block of the retention subset.

19. The method of claim 18, wherein the determining comprises:
selecting a maximum value of the minimum retention voltages required for the blocks of the retention subset; and
setting the voltage level of the retention voltage based on the selected maximum value.

20. The method of claim 19, wherein the determining further comprises:
accessing storage circuitry configured to store a corresponding minimum retention voltage for each block of the plurality of blocks.

* * * * *